(12) United States Patent
Takakamo et al.

(10) Patent No.: US 7,353,123 B2
(45) Date of Patent: Apr. 1, 2008

(54) LEAKAGE CURRENT OR RESISTANCE MEASUREMENT METHOD, AND MONITORING APPARATUS AND MONITORING SYSTEM OF THE SAME

(75) Inventors: Naohiro Takakamo, Shibata (JP); Sakai Kuniyoshi, Niigata (JP); Nobuyuki Kawauchi, Nakaiyou (JP)

(73) Assignee: Hitachi, Ltd., Tokyo (JP)

( * ) Notice: Subject to any disclaimer, the term of this patent is extended or adjusted under 35 U.S.C. 154(b) by 95 days.

(21) Appl. No.: 11/179,705

(22) Filed: Jul. 11, 2005

(65) Prior Publication Data
US 2006/0020406 A1    Jan. 26, 2006

(51) Int. Cl.
G01R 19/00    (2006.01)
G01R 15/00    (2006.01)

(52) U.S. Cl. ......................... 702/64; 702/57
(58) Field of Classification Search .................. 702/57, 702/64
See application file for complete search history.

(56) References Cited

U.S. PATENT DOCUMENTS

| | | | |
|---|---|---|---|
| 3,732,490 A | 5/1973 | Botka | |
| 6,072,708 A | 6/2000 | Fischer | |
| 6,107,560 A | 8/2000 | Takehara et al. | |
| 6,327,124 B1 | 12/2001 | Fearing et al. | |
| 6,421,618 B1 | 7/2002 | Kliman et al. | |
| 6,593,751 B2 | 7/2003 | Takahashi | |
| 6,633,169 B1 | 10/2003 | Cavigelli | |
| 6,658,360 B1 | 12/2003 | Gies et al. | |
| 6,812,396 B2 | 11/2004 | Makita et al. | |
| 7,161,354 B2* | 1/2007 | Takakamo et al. | 324/522 |
| 2005/0225909 A1* | 10/2005 | Yoshizaki et al. | 361/42 |

FOREIGN PATENT DOCUMENTS

| | | |
|---|---|---|
| JP | 06-043196 | 2/1994 |
| JP | 10-080051 | 3/1998 |
| JP | 11-038073 | 2/1999 |
| JP | 11-142466 | 5/1999 |
| JP | 11-304855 | 11/1999 |
| JP | 2001-215247 | 8/2001 |
| JP | 2004-184346 A | 7/2004 |
| JP | 2005-172617 * | 6/2005 |
| JP | 2005-172617 A | 6/2005 |

OTHER PUBLICATIONS

Taskinen "Monitor Ground Fault Leakage Circuit" EC&M Magazine available at www.ecrnweb.com (Aug. 1998).

* cited by examiner

Primary Examiner—John Barlow
Assistant Examiner—Cindy D Khuu
(74) Attorney, Agent, or Firm—Townsend and Townsend and Crew LLP

(57) ABSTRACT

A measurement method is disclosed for measuring the resistance component leakage current. The signal waveform of at least one AC cycle is sampled in the resistance component leakage current measurement, and the resistance component leakage current is measured. A zero-cross detecting circuit for detecting a voltage zero-crossing point of the target measurement circuit and outputting a sampling start signal is provided, voltage digital data of the sine wave form whose effective value is 1 and the output signal of the zero-phase current transformer are sampled, and the products of multiplication are averaged by synchronizing the sampled output signal value and the voltage digital data to obtain an active leakage component current of leakage currents.

3 Claims, 18 Drawing Sheets

FIG. 12
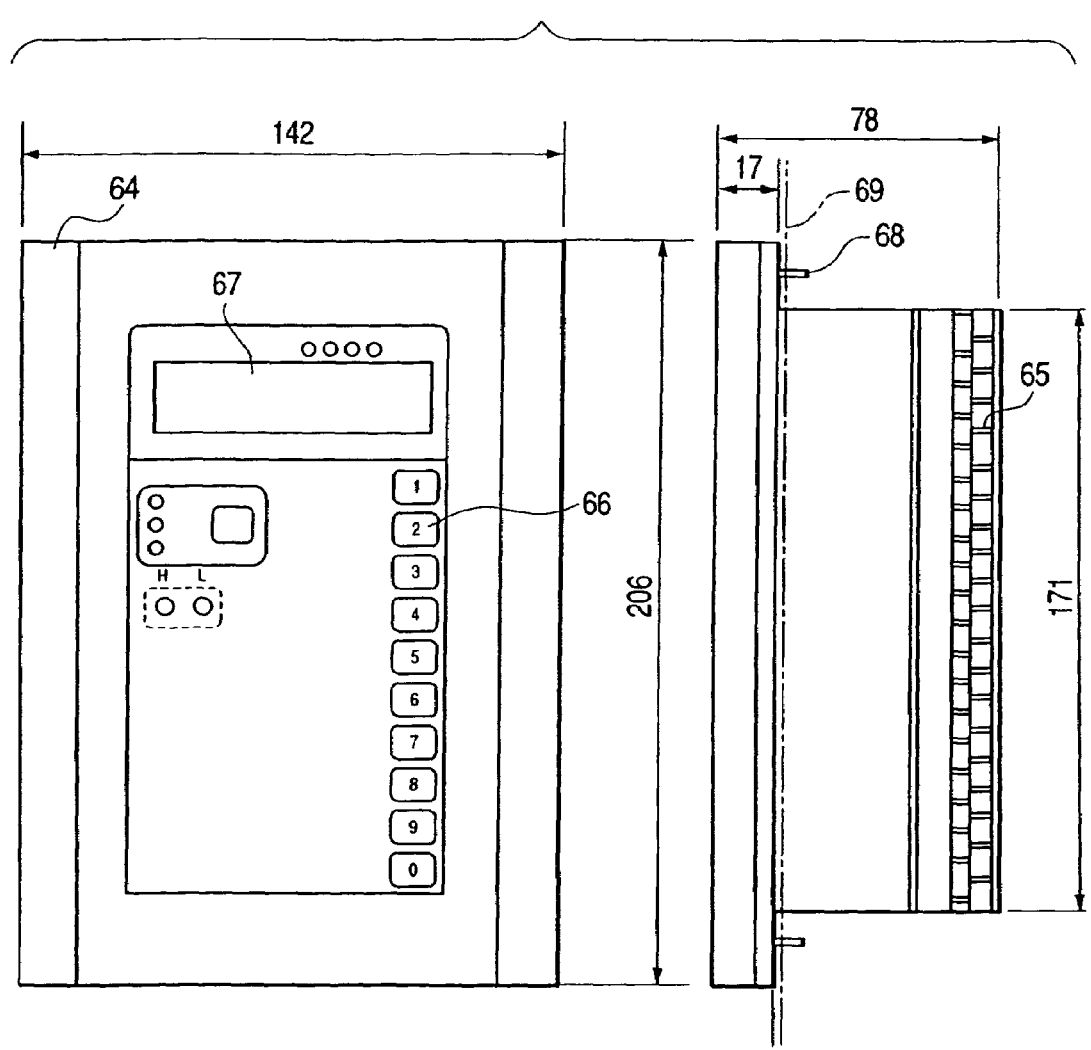
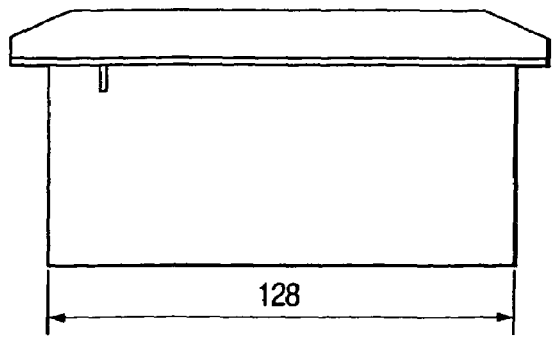

LEAKAGE CURRENT OR RESISTANCE MEASUREMENT METHOD, AND MONITORING APPARATUS AND MONITORING SYSTEM OF THE SAME

CROSS-REFERENCES TO RELATED APPLICATIONS

This application is a continuation-in-part application of U.S. application Ser. No. 10/856,563, filed May 27, 2004, which is a divisional of U.S. application Ser. No. 10/265,040, filed Oct. 4, 2002, which in turn is related to and claims priority from Japanese Application No. 2001-308552, filed Oct. 4, 2001 and Japanese Application No. 2002-272428, filed Sep. 19, 2002, all of which are fully incorporated herein by reference for all purposes.

BACKGROUND OF THE INVENTION

This invention relates to a method for measuring the resistance component leakage current included in a leakage current to monitor the insulation of a distribution system, and relates to an instrument, apparatus, or system to which this measurement method is applied.

(A) A direct measurement method in which a zero-phase current transformer is provided to a distribution circuit or a grounding conductor of a transformer, (B) a measurement method in which a voltage is applied externally on a grounding conductor of a transformer or a distribution circuit, or (C) a method in which a leakage current is measured based on the output of a zero-phase current transformer and the voltage of a distribution circuit have been proposed as the method for measurement of the leakage current or insulation resistance of a conventional distribution system.

The exemplary disclosure that belongs to (A) includes Japanese Patent Laid-Open No. H2-129556, the exemplary disclosure that belongs to (B) includes Japanese Patent Laid-Open No. S63-238470, Japanese Patent Laid-Open No. H1-143971, Japanese Patent Laid-Open No. H2-83461, Japanese Patent Laid-Open No. H4-52565, Japanese Patent Laid-Open No. H6-258363, Japanese Patent Laid-Open No. H9-318684, and Japanese Patent Laid-Open No. H11-304855, and the exemplary disclosure that belongs to (C) includes Japanese Patent Laid-Open No. H3-179271, Japanese Patent Laid-Open No. H4-220573, Japanese Patent Laid-Open No. H6-339218, Japanese Patent Laid-Open No. H2001-225247, Japanese Patent Laid-Open No. H2001-21604, Japanese Patent Laid-Open No. H2001-215247, and Japanese Patent Laid-Open No. H10-78462.

These disclosures are summarized in FIG. 9.

FIG. 9 is a structural diagram showing a leakage current measurement system. In FIG. 9, 40 denotes a transformer, 41 denotes a breaker, 42 denotes a primary circuit of a distribution system, 43a, 43b, and 43c denote loads of electric components, 44 denotes a grounding conductor of the transformer 40, 45 denotes an apparatus for measurement of the leakage current based on the received output of a current transformer 46, 47a, 47b, and 47c denote electrostatic capacities generated on the distribution path, 48a, 48b, and 48c denote power switches of the loads 43a to 43c, and 49 denotes an electrostatic capacity of a noise filter provided to the load. 50 denotes a voltage application apparatus for applying a voltage on the ground conductor 44 of the transformer 40, and 51 denotes the insulation resistance of the load 43a or the insulation resistance of wiring of the primary circuit 42 for the purpose of convenience.

Iz denotes a leakage current of the primary circuit, Ic denotes a capacitative leakage current (reactive leakage component current) that flows in the electrostatic capacity, and Igr denotes a resistance component leakage current (active component leakage current) that flows in the insulation resistance component.

In FIG. 9, in the above-mentioned measurement method (A), the zero-phase current transformer is provided to the grounding conductor 44 of the transformer 40 to measure the leakage current. In the measurement method (B), a voltage of about 1 Hz/1 V is applied from the voltage application apparatus 50 so that a current does not flow to the electrostatic capacities 47a to 47c to eliminate the effect of the electrostatic capacity, and a signal generated from the zero-phase current transformer 46 is measured by use of the instrument 45. In the measurement method (C), the measurement is carried out based on the voltage applied from the primary circuit 42 of the distribution system and the output of the zero-phase current transformer 46.

FIG. 10 is a vector diagram showing the vectors of the leakage current Iz, the capacitative current that flows in the electrostatic capacity, and the resistance component leakage current that flows in the insulation resistance component. In FIG. 10, the phase angle between the phase voltage and the line voltage is 30 degrees in the case of the three-phase alternating voltage. The capacitative current Ic is 90 degrees different from the resistance component leakage current Igr, and the leakage current Iz is the composite current of the current Ic and the current Igr, namely vector sum. However, the capacitative current varies depending on the magnitude of the loading. For example, when all the loads 43a to 43c are loaded, the capacitative current increases as shown with Ic'. As the result, the leakage current Iz changes to Iz'. In other words, the currents Iz' and Ic' change depending on the variation of the load.

The above-mentioned method (A) is involved in a problem of incapable of measurement of the resistance component leakage current if the electrostatic capacity is large due to a noise filter because the reactive leakage component current is predominant.

The above-mentioned method (B) is also involved in a problem of complex system structure due to the requirement of external application of a voltage and the requirement of no effect on the loading apparatus.

One exemplary method of the above-mentioned method (C) is involved in a problem of unsuitability for a plurality of distribution circuits because an auxiliary impedance element is provided and the insulation resistance is determined.

Another exemplary method of the above-mentioned method (C), in which the phase angle is determined to calculate the resistance component leakage current and resistance value and to further detect the insulation deterioration phase, is involved in the difficulty in determination of the correct phase angle in the small current region because of the characteristic of the current transformer.

It is also necessary to measure the voltage level of the target measurement circuit, and a component for this purpose is required, resulting in problems of greater complexity and a higher cost. On the other hand, a zero-phase current transformer widely differs in phase characteristics from product to product, resulting in a problem of poorer accuracy and incapability for general use in combination with others.

BRIEF SUMMARY OF THE INVENTION

It is one object of the present invention to obtain the highly reliable resistance component leakage current value and the resistance value, namely the insulation resistance, to solve the above-mentioned problem of the conventional methods. It is the other object of the present invention to monitor the change of insulation deterioration with time for alarming, to enable to check and keep maintenance, and to prevent sudden failure.

To achieve the above-mentioned objects, the present invention provides the following methods.

(1) A method for measuring the resistance component leakage current of a target measurement circuit from the signal of a current transformer for detecting the leakage current of the target measurement circuit and the voltage signal of the target measurement circuit, wherein the waveform signal of at least one cycle is sampled, and the resistance component leakage current is obtained from the result of division of the average of the integrated value of the instantaneous voltage values and the instantaneous leakage current values by the square root of average of squared instantaneous voltage values.

(2) A method for measuring the resistance component current of a three-phase AC target measurement circuit from the signal of a current transformer for detecting the leakage current of the target measurement circuit and the voltage signal of the target measurement circuit, wherein the waveform signal of at least one cycle is sampled and the voltage signal is stored, and the resistance component leakage current is obtained from the result of division of the average of integrated value of the instantaneous value of the leakage current and the instantaneous value of the stored voltage signal at the phase angle of 30 degrees advance by the square root of average of squared instantaneous values of the voltage signal.

(3) A method for measuring the resistance component leakage current of a three-phase AC target measurement circuit from the signal of a current transformer for detecting the resistance component leakage current of the target measurement circuit and the voltage signal of the target measurement circuit, wherein the waveform signal of at least one cycle is sampled and the voltage signal is stored, and the resistance component leakage current is obtained from the result of division of the average of integrated value of the instantaneous value of the leakage current and the instantaneous value of the stored voltage signal at the phase angle 30 degrees advance by the square root of average of squared instantaneous values of the voltage signal for the three-phases. Each phase voltage of the three-phases used for calculation of the resistance component leakage current may be obtained by means of a method in which the line voltage signal of two phases is obtained and the residual one phase voltage is obtained by means of the vector arithmetic, or may be obtained by means of a method in which one line voltage signal is obtained, and the residual two phase voltage signals are obtained by retarding phase angle of the above-mentioned voltage signal by 120 degrees and 240 degrees respectively. Otherwise in the case that the voltage-to-ground is used, the residual one phase voltage may be obtained from the voltage-to-ground of two lines and the residual one phase voltage is obtained by means of the vector arithmetic, or may be obtained by means of a method in which the voltage-to-ground of one line is obtained, and the phase voltage of the residual two phases is obtained by retarding phase angle of the above-mentioned voltage signal by 120 degrees and 240 degrees respectively.

(4) A method for measuring the resistance component current of a target measurement circuit from the signal of a current transformer, installed in the target measurement circuit, for detecting the leakage current and the voltage signal of the target measurement circuit, provided with a zero-cross detecting circuit for detecting the voltage zero-crossing point of the target measurement circuit and outputting a sampling start signal, a memory unit for storing voltage sine wave data (digital data) whose effective value is 1 and a CPU mainly intended for arithmetic processing samples the leakage current in response to the sampling start signal, averages the products of multiplication by synchronizing the sampled output signal with the digital data of the sine wave whose effective value is 1, and obtains the active component leakage current of leakage currents.

(5) The memory unit in paragraph (4) above stores digital data of the sine wave form whose effective value is 1 in a finely split form, and performs multiplication by using digital data delayed or advanced by the same quantity as the advance or the delay of the phase of the output signals of the zero-phase current transformer.

(6) Further, the memory unit in paragraph (4) above stores digital data of the sine wave form whose effective value is 1 as digital data advanced by 30 degrees, and performs their multiplication by sampled output signal values of the zero-phase current transformer to compute the active components of leakage currents from a three-phase delta circuit.

The present invention provide highly reliable measurement of the resistance component leakage current value and the resistance value and can be used to specify the insulation deterioration phase, the change of insulation deterioration over time is checked for alarming, and enables advance check and keep maintenance to be performed. As a result, sudden failure can be prevented.

BRIEF DESCRIPTION OF THE DRAWINGS

FIG. 12 is an apparent view of another exemplary insulation monitoring apparatus;

DETAILED DESCRIPTION OF THE INVENTION

Embodiments of the present invention will be described in detail hereinafter with reference to the drawings.

Figure 1:
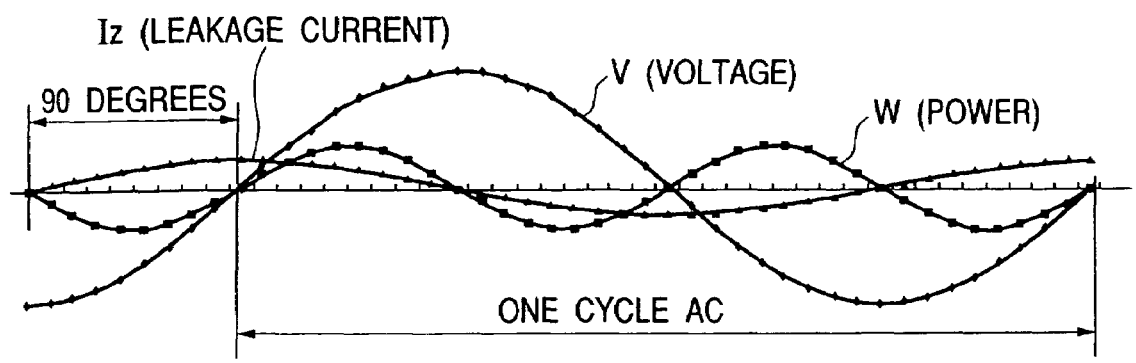
FIG. 1 is a waveform diagram for describing the first embodiment of the leakage current measurement method in accordance with the present invention.
Figure 9:
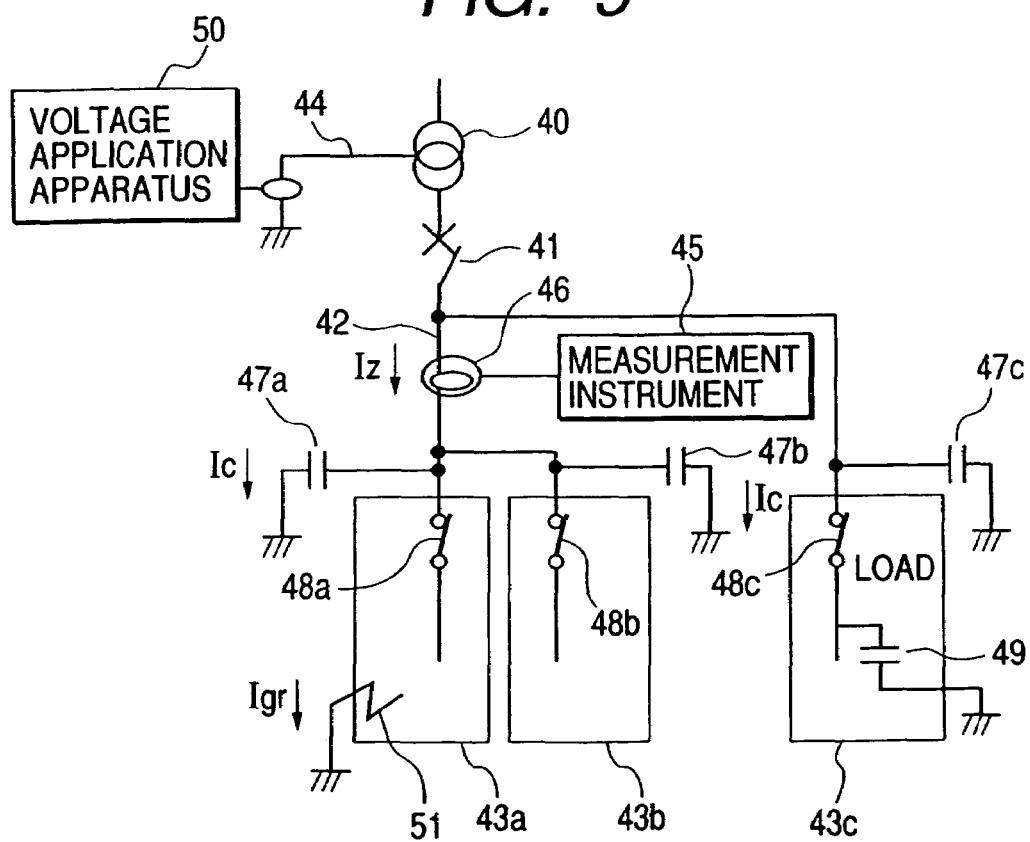
FIG. 9 is a structural diagram showing a leakage current measurement system.

FIG. 1 is a waveform diagram for describing the first embodiment of the leakage current measurement method in accordance with the present invention, and the principle of calculation of the resistance component leakage current from the leakage current by use of this waveform diagram. The waveform shows a waveform for the case that the primary circuit 42 of the distribution system shown in FIG. 9 is a single-phase circuit, in which the output of the current transformer 46 and the voltage waveform generated from the primary circuit 42 are represented by the time axis.

In FIG. 1, Iz denotes the leakage current, V denotes the voltage, W denotes the leakage current power, and dots of each waveform show the sampling value. The phase of the leakage current Iz proceeds 90 degrees ahead of the voltage if no active component leakage current Igr is involved.

The power W of the AC circuit is calculated by use of the equation W=VI cos Φ according to the AC theory, wherein V denotes the circuit voltage, I denotes the load current, and cos Φ denotes the phase angle (power factor angle) of the voltage and the load current. The instantaneous value of the voltage and current waveform for one AC cycle is sampled and the average integrated value of instantaneous voltage values and instantaneous load current values is calculated.

Figure 10:
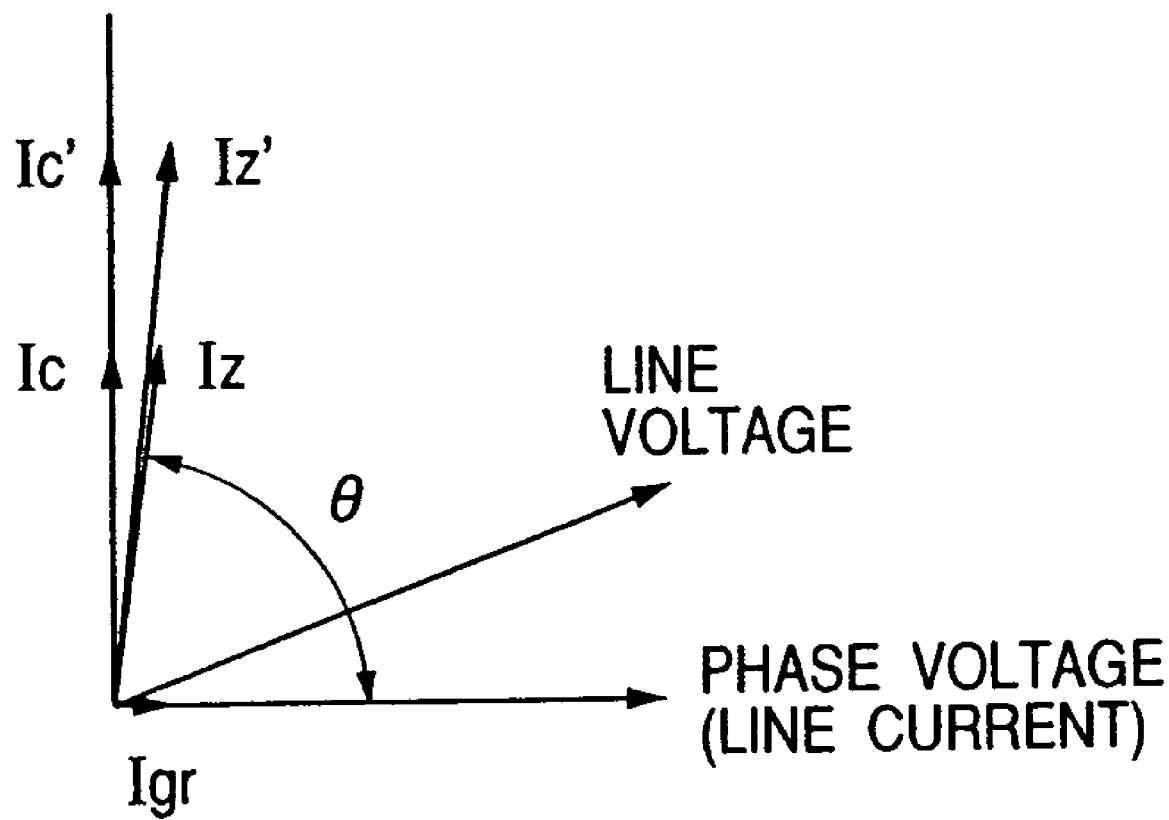
FIG. 10 is a vector diagram showing the vector of the leakage current Iz of the primary circuit, the capacitative current that flows in the electrostatic capacity, and the resistance component leakage current that flows in the insulation resistance component.

As shown in FIG. 10, the active component leakage current Igr is given by the equation Iz cos Φ, wherein the Iz denotes the leakage current. This embodiment is characterized in that the power which is replaced with the leakage current Iz instead of the load current I of the equation W=VI cos Φ (leakage current power) is calculated and the power is further divided by the voltage to obtain the active component leakage current Igr.

In other words, W/V=Iz cos Φ=Igr. As the result, the resistance component leakage current (active component current) Igr is obtained. Herein, the voltage means the voltage for one AC cycle, and the voltage is obtained as the square root of the averaged square of sampled instantaneous voltage values.

As obvious from the above-mentioned equation, the power W and the voltage V are used as a means for calculating the resistance component leakage current Igr, and the taken-in voltage V may be arbitrary. It is understandable that if the resistance component leakage current included in the leakage current increases in FIG. 1, it comes near to the voltage phase and the power comes to the positive side.

Next, the second embodiment of the present invention will be described with reference to FIG. 2.

Figure 2:
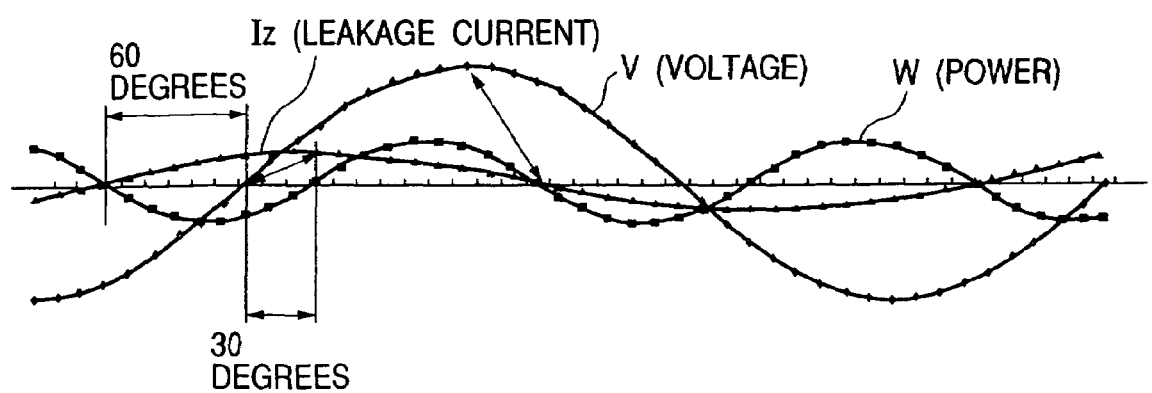
FIG. 2 is a waveform diagram for describing the second embodiment of the leakage current measurement method in accordance with the present invention.

FIG. 2 is a waveform diagram for describing the second embodiment of the leakage current measurement method in accordance with the present invention, and shows the voltage waveform, leakage current waveform, and leakage current power waveform for the case in which the power is supplied to the load with two-wire drawing from the first phase (RS) of the three-phase AC. In this case, the phase of the leakage current Iz proceeds 60 degrees ahead of the voltage (line voltage) if only the electrostatic capacity is involved. The reason is that the line voltage in the three-phase AC proceeds 30 degrees ahead of the phase voltage. Therefore, the second embodiment is characterized in that the instantaneous line voltage value is stored when the leakage current and the line voltage are sampled and the power calculated by use of the instantaneous leakage current value and the stored instantaneous voltage value that proceeds 30 degrees advance is obtained, and the power is divided by the voltage to calculate the resistance component leakage current. Herein, the voltage is also the square root of average of squared instantaneous values of one AC cycle as in the case of the first embodiment.

Next, the third embodiment of the present invention will be described with reference to FIG. 3.

Figure 3:
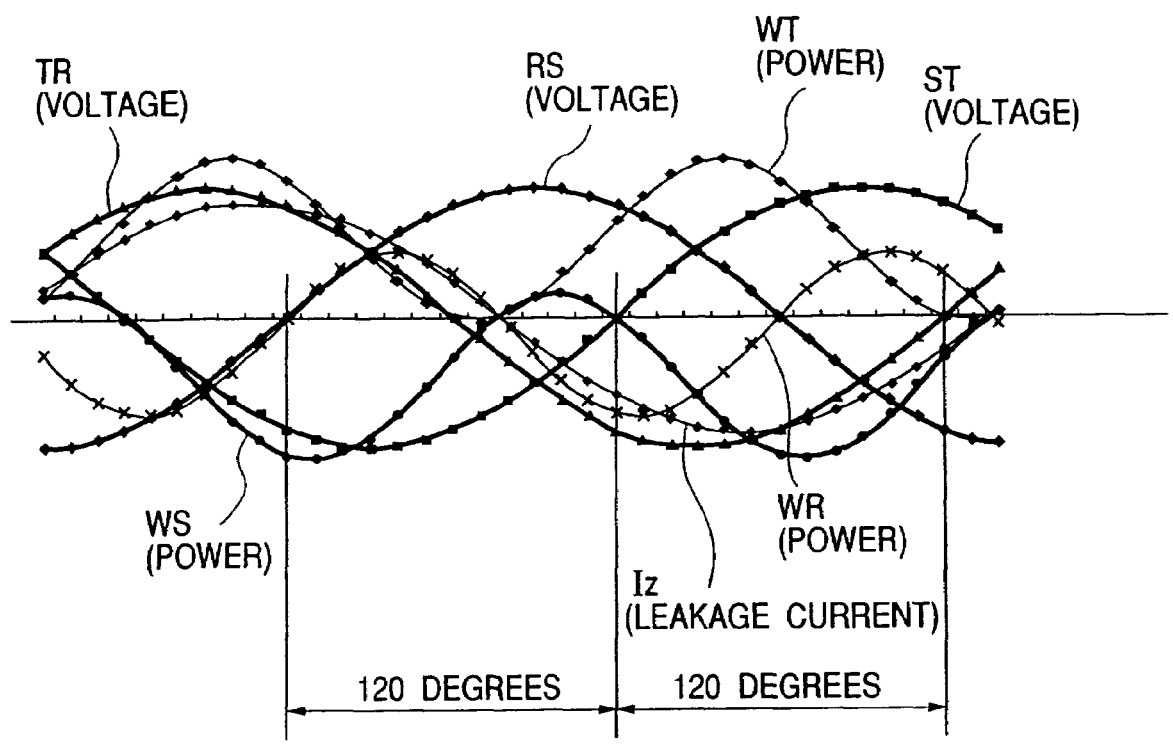
FIG. 3 is a waveform diagram for describing the first embodiment of the leakage current measurement method in accordance with the present invention.

FIG. 3 is a waveform diagram for describing the third embodiment of the leakage current measurement method in accordance with the present invention, and shows the voltage waveform of the three-phase AC (voltage RS, voltage ST, and voltage TR) and the leakage current waveform Iz of the three-phase AC. The voltage of the respective voltage waveforms of the three-phase AC is the line voltage. As it is well known, respective line voltages proceed with intervals of 120 degrees phase difference. When the leakage current is sampled correspondingly to each voltage waveform, the leakage current Iz proceeds 60 degrees ahead of the line voltage as shown in FIG. 3 in the case that only the electrostatic capacity is involved similarly to the second embodiment. Therefore, the instantaneous line voltage values are stored when the leakage current and instantaneous values of each line voltage waveform are sampled, each power is calculated by use of the instantaneous leakage current value and each stored instantaneous voltage value that proceeds 30 degrees advance, each power is divided by each voltage, the phase that has the positive maximum value among the resultant quotients corresponds to the insulation deterioration phase, and this value is regarded as the resistant component leakage current value. Each phase voltage used when the resistance component leakage current of each phase of the three-phase is calculated may be obtained by means of a method in which line voltage signals of two phases are obtained and the residual one phase is obtained by the vector arithmetic, or may be obtained by means of a method in which one line voltage signal is obtained and residual two phases are obtained from the voltage signal obtained as described hereinabove by retarding the phase angle by 120 degrees and 240 degrees. In the case that the voltage-to-ground is used, the residual one phase may be obtained by the vector arithmetic by use of the voltage-to-ground of the two lines, or may be obtained by means of a method in which the voltage-to-ground of one line is obtained and residual two phases are obtained by retarding the phase angle by 120 degrees and 240 degrees from the voltage signal obtained as described hereinabove.

Next, the sampling will be described hereunder. The sampling means measurement of the waveform for one AC cycle at a predetermined time intervals, and the predetermined time interval means, for example, 0.5556 ms for 50 Hz that is a value obtained by dividing by 36, or 0.463 ms for 60 Hz that is a value obtained by dividing by 36.

Next, the fourth embodiment of the present invention will be described hereunder.

Figure 14:
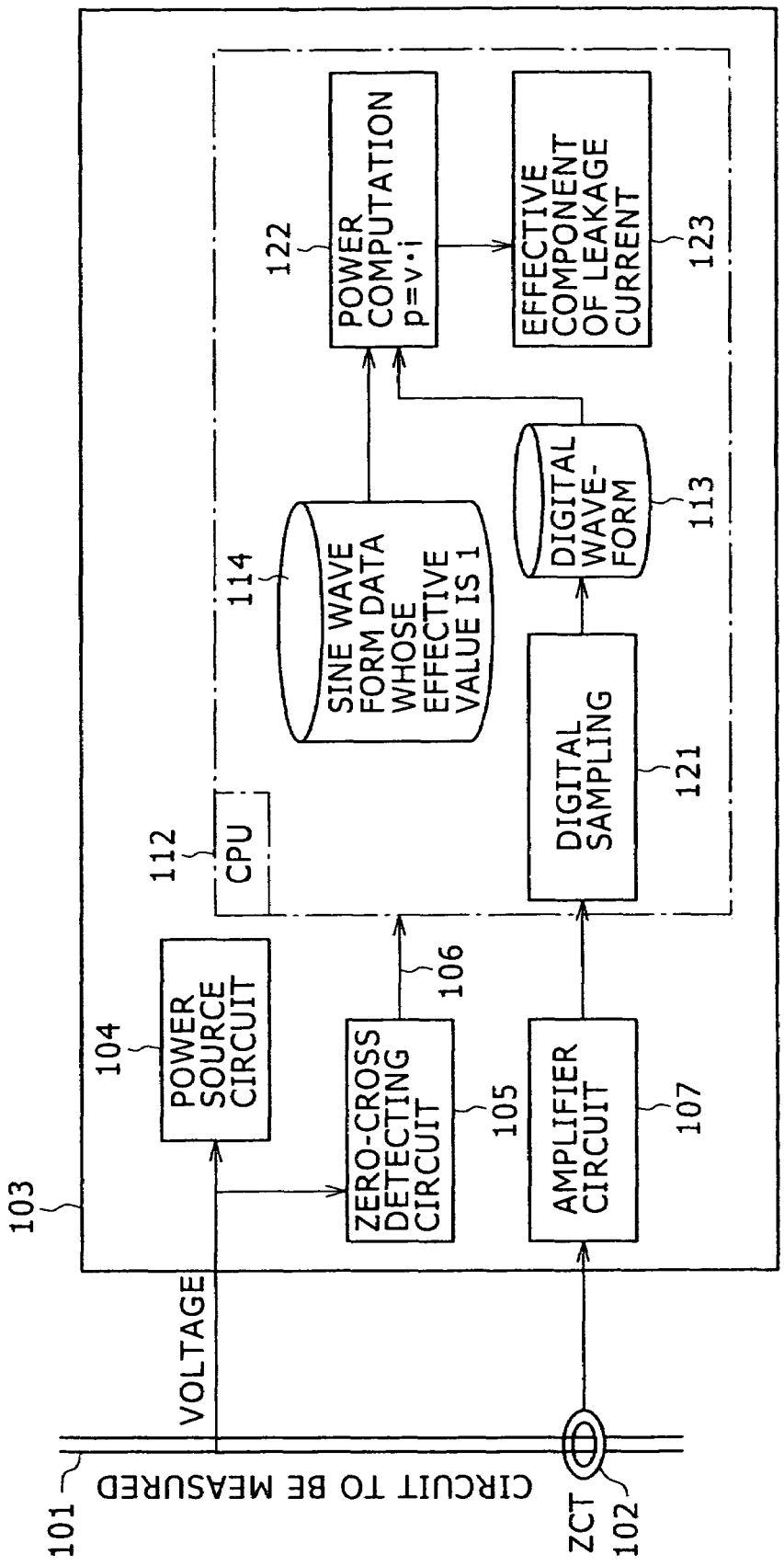
FIG. 14 is a diagram for describing the algorithm of the leakage current measurement apparatus of the fourth embodiment.

Although it is stated that the input voltage level may be arbitrary in the embodiments described above, further description will be made with reference to FIG. 14. Reference numeral 101 denotes a target measurement circuit; 102 denotes a zero-phase current transformer; and 103 denotes a leakage current measurement apparatus. Reference numeral 105 denotes a zero-cross detecting circuit for detecting the zero-crossing point of the voltage waveform of the target measurement circuit and generating a sampling start signal to be described afterwards; 106 denotes the sampling start signal which is the output signal of the zero-cross detecting circuit; 107 denotes an amplifier circuit for amplifying the output signal of any leakage current detected by the zero-phase current transformer 102; and 112 denotes a CPU which digitally samples with 121 the amplified leakage current signal waveform and stores the digital waveform into a memory unit 113 and mainly performs arithmetic processing of power with sine wave form data whose effective value is 1 stored in a memory unit 114.

Thus, a leakage current power P is the product (power factor) of a voltage V, a current I and a phase angle $\phi$, and the formula for its calculation is represented by $P=VI \cos \phi$. On the other hand, it will be readily understood from the calculation formula stated above that the quotient of the division of this leakage current power P by the voltage V is the active component current.

Further, the leakage current power p in the sampling system is the average of the instantaneous value products (p=vi) of the voltage v and the current (leakage current) i (122 in the diagram), and the active component current is obtained by dividing this average leakage current power p by the voltage v (123 in the diagram).

A characteristic of this embodiment lies in that sine wave form data whose effective value is 1 is used without measuring the voltage. Thus, the zero-crossing point of the voltage waveform is used as the starting point of sampling, with the sine wave form data whose effective value is 1 being substituted. As the above-mentioned leakage current power is obtained by multiplying the leakage current by the voltage and the power is then divided by the voltage, the data of waveform whose effective value is 1 can make the leakage current power an active component current. To add, since there are other elements of the amplifier unit 107, the leakage current amperage is obtained by multiplying the result by the current coefficient.

Incidentally, since the imbalance rate of the voltage of the circuit to be measured is usually ±2% or less and the influence of voltage imbalance on the leakage current power is extremely small, it can be replaced with the above-mentioned sine wave form data whose effective value is 1.

Figure 15:
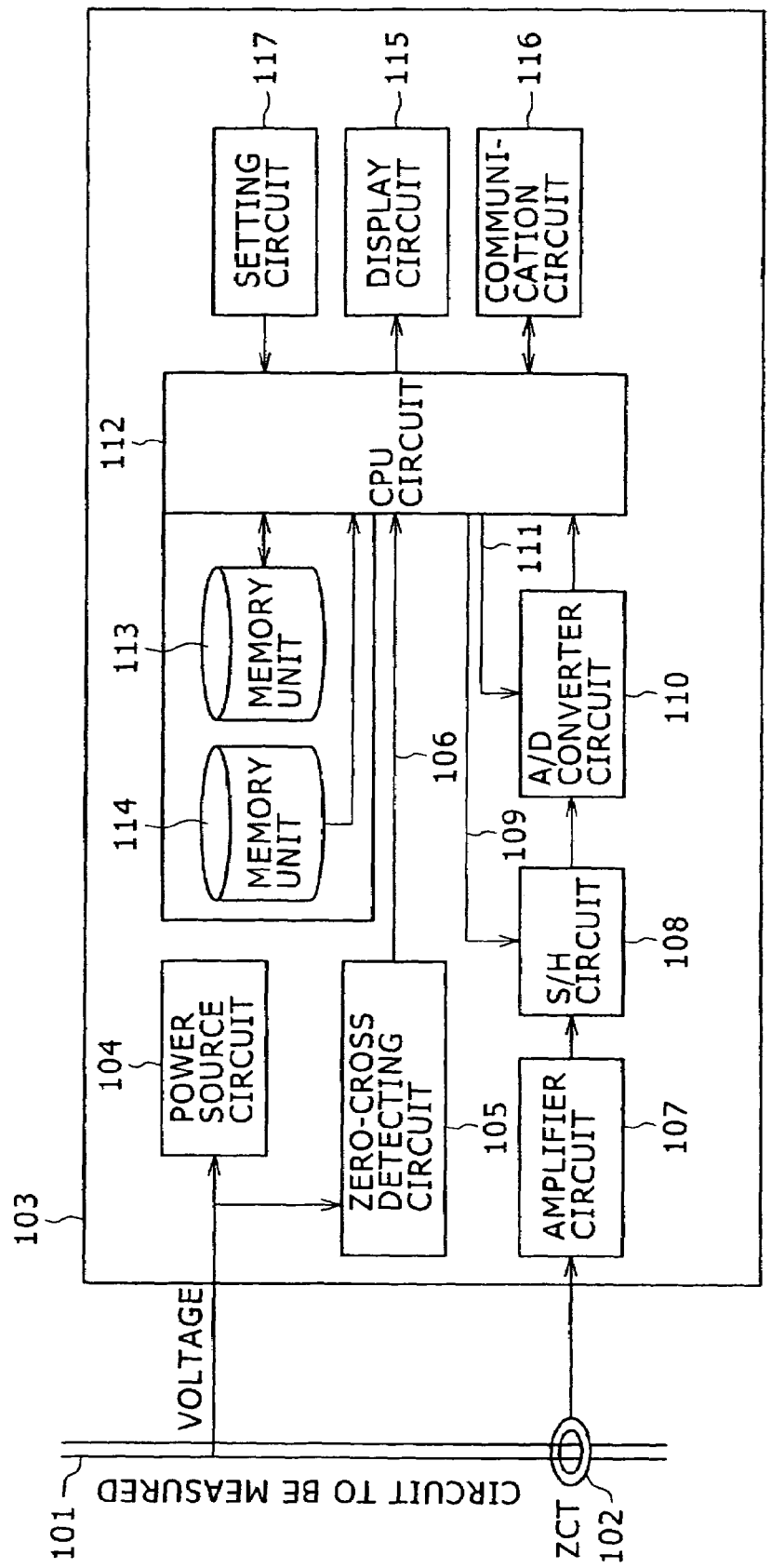
FIG. 15 is a structural diagram showing the leakage current measurement apparatus of the fourth embodiment.

Whereas the effective component of the leakage current is measured according to the algorithm described above, FIG. 15 shows a block diagram of the leakage current measurement apparatus 103 embodying the foregoing particulars. Incidentally, a description of the constituent parts already described will be dispensed with. Reference numeral 104 denotes a power source circuit for supplying a stable voltage into the leakage current measurement apparatus; and 107 denotes the above-mentioned amplifier circuit which converts the detection signal (current signal) of the zero-phase current transformer into a voltage signal and amplifies it to an appropriate amplitude. Reference numeral 108 denotes a sample hold circuit (S/H circuit) for primarily holding the converted voltage signal, which varies from moment to moment, via a signal line 109 at an instruction from the CPU 112; and 110 denotes an A/D converter circuit for subjecting the output signal of the S/H circuit to analog-to-digital conversion via a signal line 111 at an instruction from the CPU 112, and the resultant converted data becomes the sampled data of the leakage current.

The CPU 112 has a nonvolatile memory unit 114 for storing sine wave form data whose effective value is 1 and a volatile memory unit 113 for storing the sampled data, and the result of its computation is stored in the volatile memory unit 113.

Reference numeral 115 denotes a display circuit for displaying the amperages of the above-mentioned active component current and the leakage current; 117 denotes a setting circuit for selecting what is to be displayed and selecting and setting the type of zero-phase current transformer; and 116 denotes a communication circuit for transmitting the same contents as what is displayed to a host apparatus not shown. As the host apparatus can remotely measure via the communication circuit 116 the leakage current and the active component current, and at the same time save them as records, the trend graph of the effective component current can be displayed. Since the active component current, namely the state of insulation can be therefore displayed all the time, the state of any deterioration can be grasped.

Figure 16:
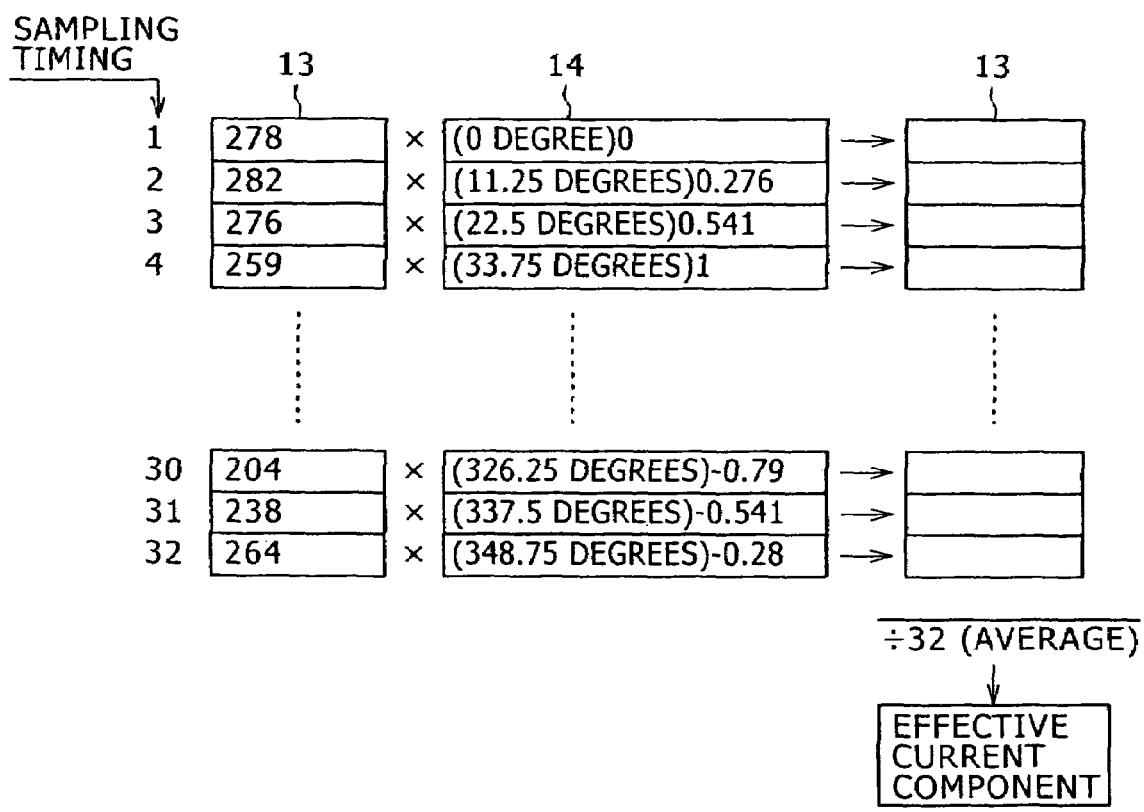
FIG. 16 is a diagram showing a specific case of computing the active component leakage current of the leakage current in the fourth embodiment.
Figure 17:
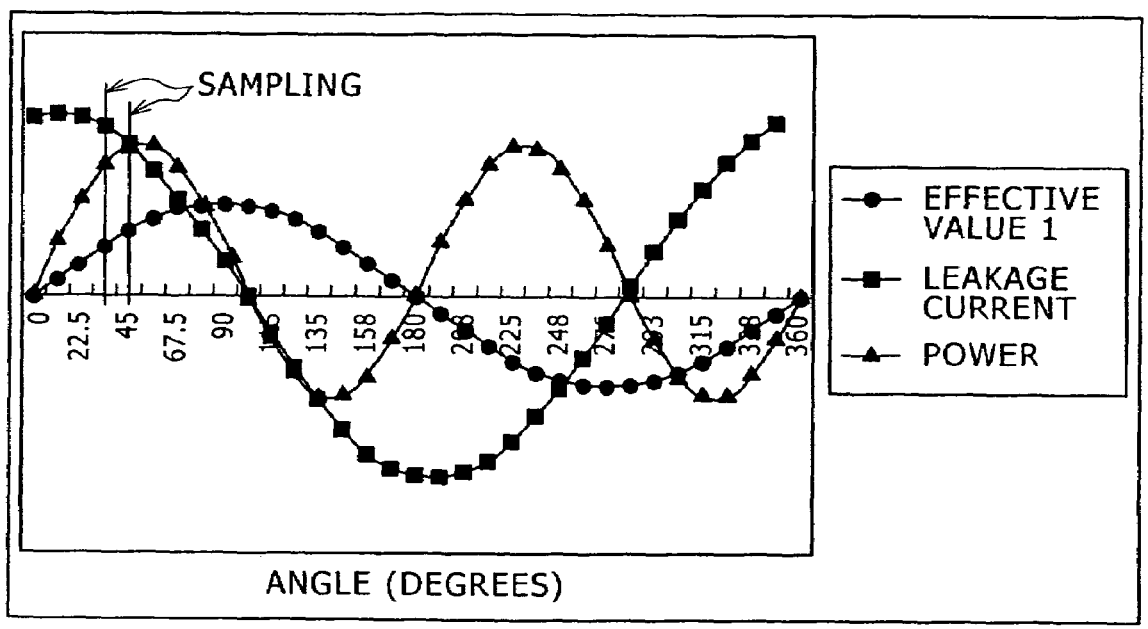
FIG. 17 is a waveform diagram for describing the algorithm of the leakage current measurement apparatus of the fourth embodiment.

FIG. 16 and FIG. 17 more specifically illustrate an example of arithmetic processing operations in measuring the active component current according to the algorithm described above; they show how the timing of sampling starts with the sampling start signal, one AC cycle is split into 32 segments to sample the leakage current as shown in FIG. 17, the obtained digital values are successively stored into the memory unit 113, at the same time those digital values are multiplied by the sine wave form data whose effective value is 1 stored in the memory unit 114, and the results are stored into the memory unit 113. Upon completion of 32 times of sampling, the above-mentioned products of multiplication are averaged, and multiplying the quotient of division by 32, because sampling has been done 32 times, by a coefficient not shown gives an active component current. The coefficient is uniquely determined by the transformation ratio of the zero-phase current transformer, the load resistance at the time of current-to-voltage conversion, the amplification rate of the amplifier circuit and the resolution of the A/D converting circuit.

To describe here the particulars of the memory unit 114 in FIG. 16, it is shown how the sine wave form data whose effective value is 1 is stored correspondingly to each of the 32 sampling angles into which the AC cycle is split, the degrees of angle are parenthesized to facilitate understanding, with actual data shown to their right. Thus the angle at the time of sampling timing 1 is 0 degree, whose data of 1 in effective value is 0; the angle at the time of sampling timing 2 is 11.25 degrees (the quotient angle of division of 360 degrees by 32), whose data of 1 in effective value is 0.276 (the fourth digit below the decimal point is rounded).

These values are sine functions of the angles of different sampling timings of the sine wave form having $\sqrt{2}$ as its wave height value.

As described above, the leakage current power can be computed and the active component current can be measured without having to measure the voltage of the target measurement circuit. To add, power in FIG. 17 refers to the leakage current power.

Next, the fifth embodiment of the present invention will be described hereunder.

Figure 18:
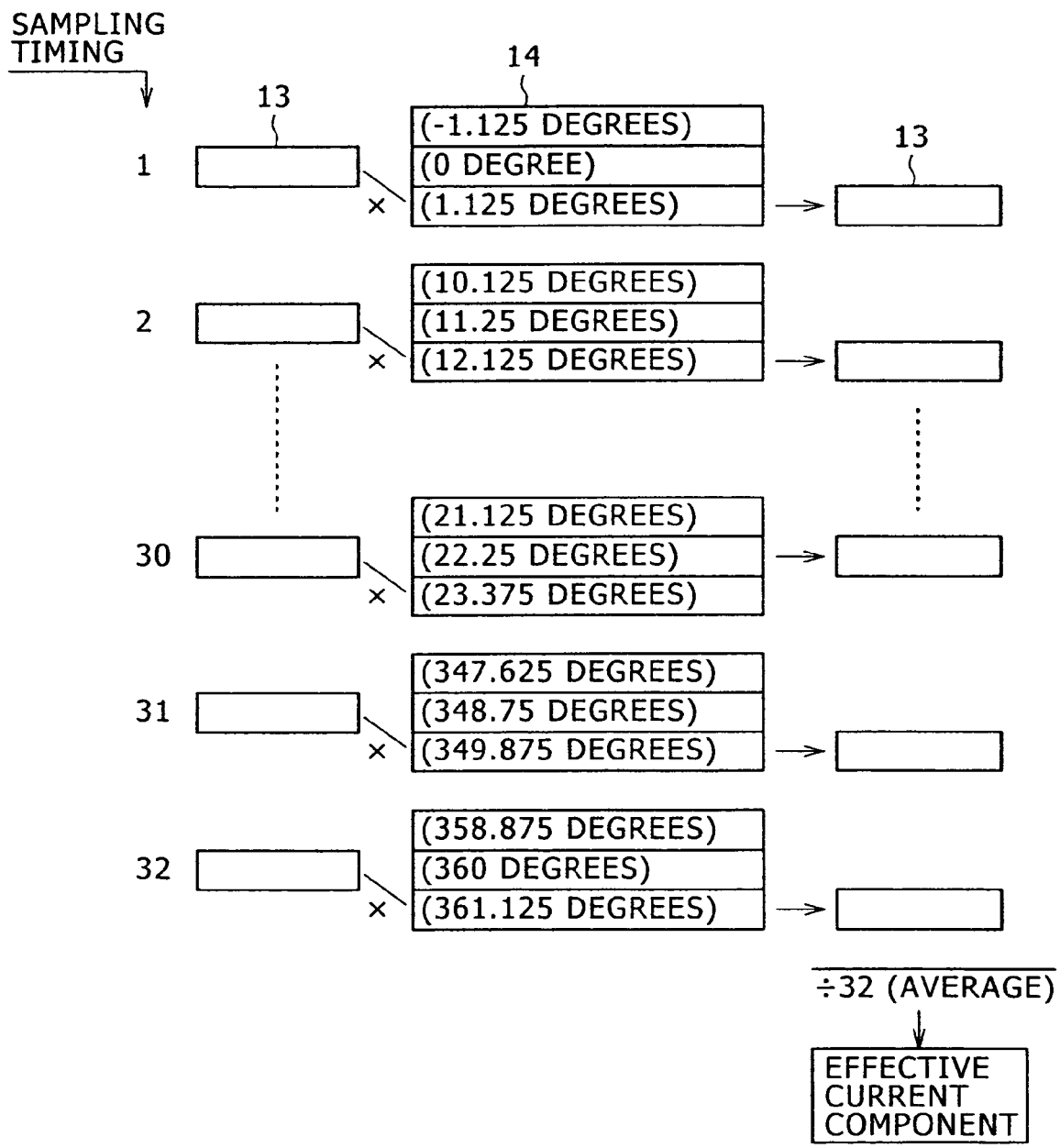
FIG. 18 shows a case of method of measuring the active component leakage current taking account of the phase characteristics of the zero-phase current transformer in the fifth embodiment.
Figure 19:
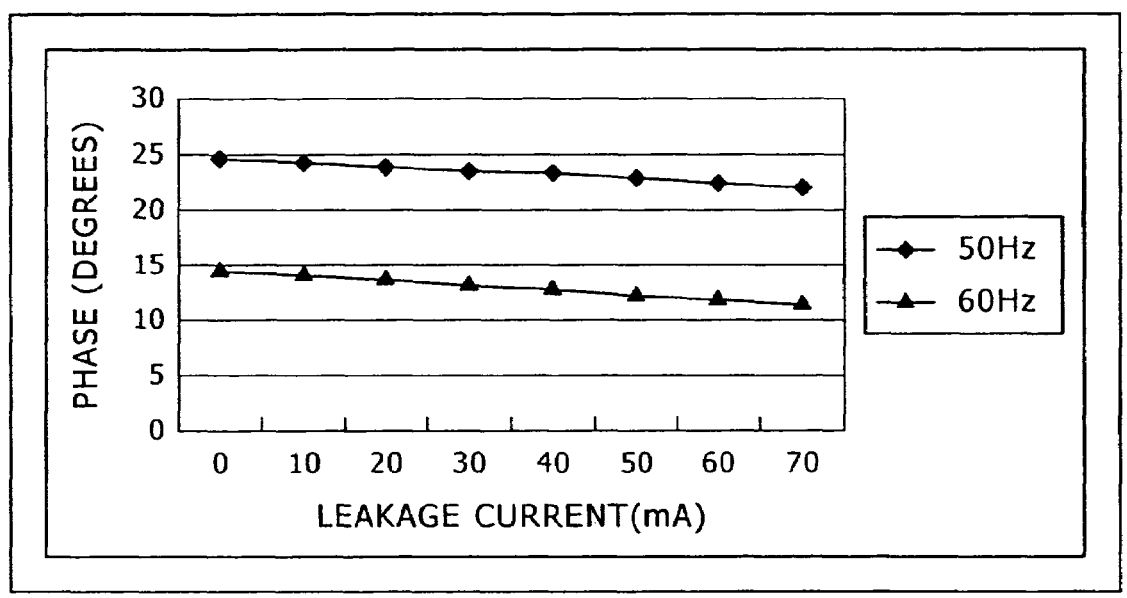
FIG. 19 is a diagram showing one example of phase characteristics of the zero-phase current transformer.

It will be described with reference to FIG. 18 and FIG. 19. Although a zero-phase current transformer having a high accuracy also excels in phase characteristic, a general-purpose one would vary in phase characteristic with the frequency, and the phase also varies with the magnitude of the leakage current to be measured. FIG. 19 shows an example of this frequency-versus-current phase characteristic relationship. Further, the phase characteristic also differs with the type of zero-phase current transformer, and the output signals of the target measurement circuit and of the zero-phase current transformer may deviate in phase from each other to make it impossible to obtain a correct active component current. A method to solve this problem is shown in FIG. 18, in which the values of sine functions corresponding to the angles before and after each point of sampling timing in FIG. 16 are arranged. FIG. 18 shows a case in which the space of one sampling time (11.25 degrees) is divided into 10 and the values of resultant sine functions of 1.125 degrees are arranged. It is evident that, by arranging all the values of the sine function in this one sampling timing space, various phase deviations can be coped with. Whereas the above-cited is a case of division into 10, increasing the number into which the division is made would allow more accurate measurement and arithmetic processing of the effective component current. FIG. 18 shows a case in which the phase of the leakage current is ahead of the phase of the target measurement circuit by about one degree in terms of the output phase of the zero-phase current transformer, and in this case multiplication is done by a data value one degree behind the sine wave form data whose effective value is 1. Thus, it means that the output phase of the zero-phase current transformer is delayed (corresponding to making it the same as the phase of the circuit to be measured) and the leakage current power is computed. Therefore, the active component leakage current is correctly measured, resulting in improved accuracy. Incidentally, while it is necessary to perform arithmetic processing at 50 Hz by delaying the phase by about 23 degrees where the phase characteristic is a shown in FIG. 19, since frequency information can be obtained by measuring the cycle of the sampling start signal outputted by the zero-cross detecting circuit, and the amperage of the current can be found by computing the effective value of the sampled leakage current, it can be determined by how many degrees the phase should be delayed.

Next, the sixth embodiment of the present invention will be described hereunder.

Figure 20:
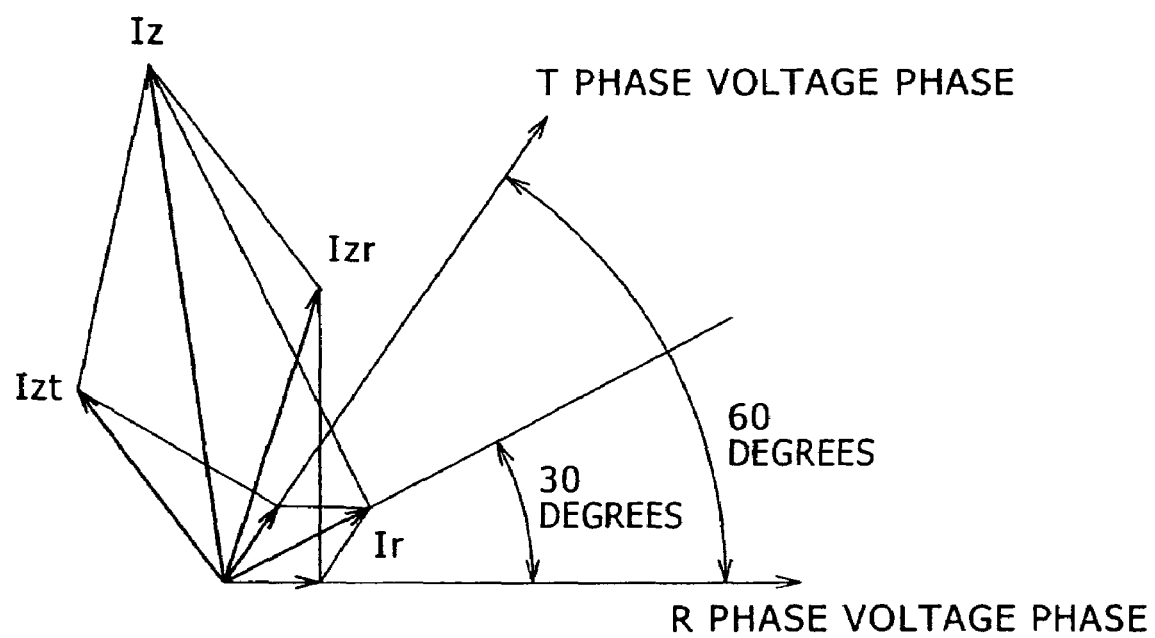
FIG. 20 is a diagram for describing the sixth embodiment, showing a vector diagram which shows the leakage current phase of a three-phase delta circuit.

Whereas the foregoing description referred to a case in which the circuit to be measured is a single-phase circuit or a single-phase three-wire circuit, the three-phase delta circuit will be described with reference to FIG. 20. As the second phase (S phase) is grounded in the three-phase delta circuit, which is a low voltage circuit, it is publicly known that, in terms of the phase voltage phase, the third phase (T phase) is advanced by 60 degrees between the first phase (R phase) voltage and the third phase (T phase) voltage as shown in FIG. 20. Where the leakage current (Izr) of the first phase (R phase) and the leakage current (Izt) of the third phase (T phase) are generated as shown in FIG. 20, the phase of the leakage current (Iz) detected by the zero-phase current transformer as stated above is the synthesized leakage current (Iz) of these Izr and Izt. The active component of the first phase (R phase) is Izr·cos $\Phi$1 and the active component of the third phase (T phase) is Izr·cos $\Phi$2, the synthetic component (Ir) of these active components appear in a position 30 degrees ahead of the first phase (R phase) as shown in FIG. 20. Herein, cos $\Phi$1 is the phase angle between the R phase voltage phase and Izr and cos $\Phi$2 is the phase angle between the T phase voltage phase and Izr. Thus they are the same as the active component of the leakage current (Iz). Incidentally, the active component should be in phase with the voltage phase, and for this reason the computation is done with the sine wave form data whose effective value is 1 advanced by 30 degrees, thereby enabling the active component leakage current to be obtained.

To add, the method of correction taking into account the phase characteristic of the zero-phase current transformer described with reference to FIG. 18 and FIG. 19 can be applied similarly, enabling the active component leakage current of leakage currents to be obtained accurately.

Further, a leakage current often contains harmonics, and a filter circuit (low pass filter) may be provided to remove such harmonics. In this case, as the filter circuit would invite a phase delay, conversely the phase should be advanced, but it is evident that this could be easily coped with because the filter characteristics can be identified.

Moreover, though the phase characteristic varies with the type of the zero-phase current transformer, if the characteristic is known in advance, this again can be coped with by setting from the above-mentioned setting unit 117 an angle at which phase correction is to be made.

Next, the seventh embodiment of the present invention will be described hereunder.

Figure 4:
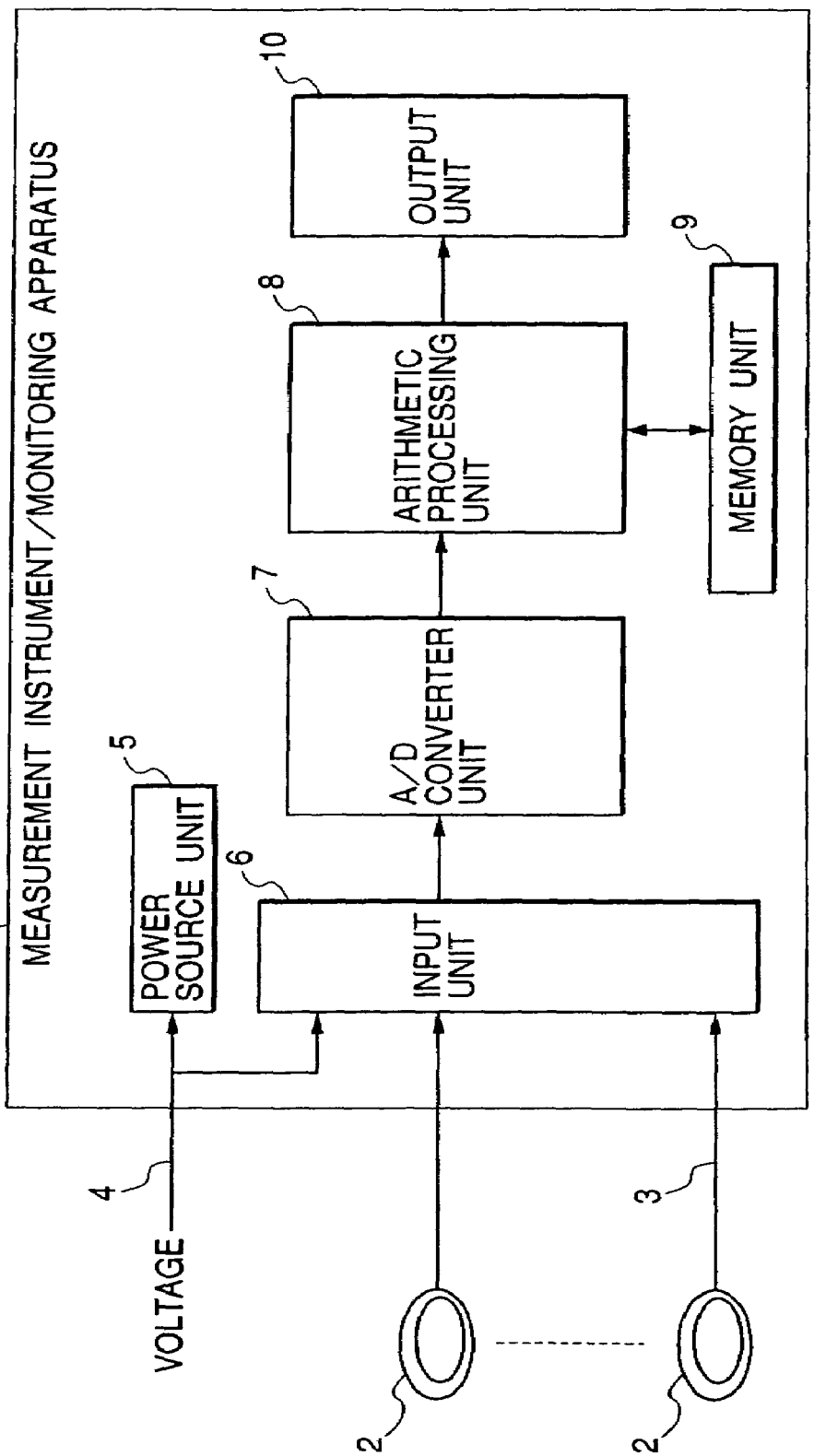
FIG. 4 is a structural diagram showing an embodiment of a leakage current measurement system that uses an instrument in accordance with the present invention.

FIG. 4 is a structural diagram showing an exemplary leakage current measurement system that uses a measurement instrument in accordance with the present invention. In FIG. 4, 1 denotes a measurement instrument, which is used also as a monitoring apparatus. The measurement instrument or monitoring apparatus 1 is provided with following components. 2 denotes a non-contact type current detector for measurement of the leakage current of a target measurement circuit, 3 denotes a signal line of the current detector, 4 denotes a voltage supply line, which is served also as a signal line, for supplying a suitable voltage to a power source unit 5 that supplies a voltage to the inside of the measurement instrument or monitoring apparatus 1, 6 denotes a input unit for converting the output received from the signal lines 3 and 4 to the suitable internal signal, 7 denotes an A/D converter unit for sampling and converting the output of the input unit 6 to the digital value in response to the command received from the arithmetic processing unit 8 that will be described hereinafter, and 8 denotes the arithmetic processing unit that is served for commanding the A/D converter unit 7 to sample a signal and convert it to a digital value, for commanding a memory unit 9 to store the obtained digital value therein, and for calculating the resistance component leakage current by means of any one of the methods described in the first embodiment to the sixth embodiment. Furthermore, the arithmetic processing unit 8 also supplies the resistance component leakage current value that is obtained as the result of calculation to an output unit 10 to be described later. The output unit 10 visually displays the calculation result obtained by means of the arithmetic processing unit 8 by use of a display apparatus or transmits the calculation result to remote sites.

In this embodiment, the voltage V supplied from the signal line (the circuit voltage is a single phase or single-phase three-lines, or two line drawing from three-phase three-lines) or the voltage RS and the leakage current Iz obtained from the leakage current detector 2, namely the vector sum of the capacitative current Ic and the resistance component current Igr, is supplied, the vector sum is converted to a digital value by means of the A/D converter unit 7, the converted vector sum is subjected to arithmetic by means of the arithmetic processing unit 8, and the resistance component leakage current (active component leakage current) of the insulation resistance is calculated. As the result, the resistance component leakage current can be obtained by means of the method described in the first to sixth embodiments.

Next, the eighth embodiment of the present invention will be described with reference to FIG. 5.

Figure 5:
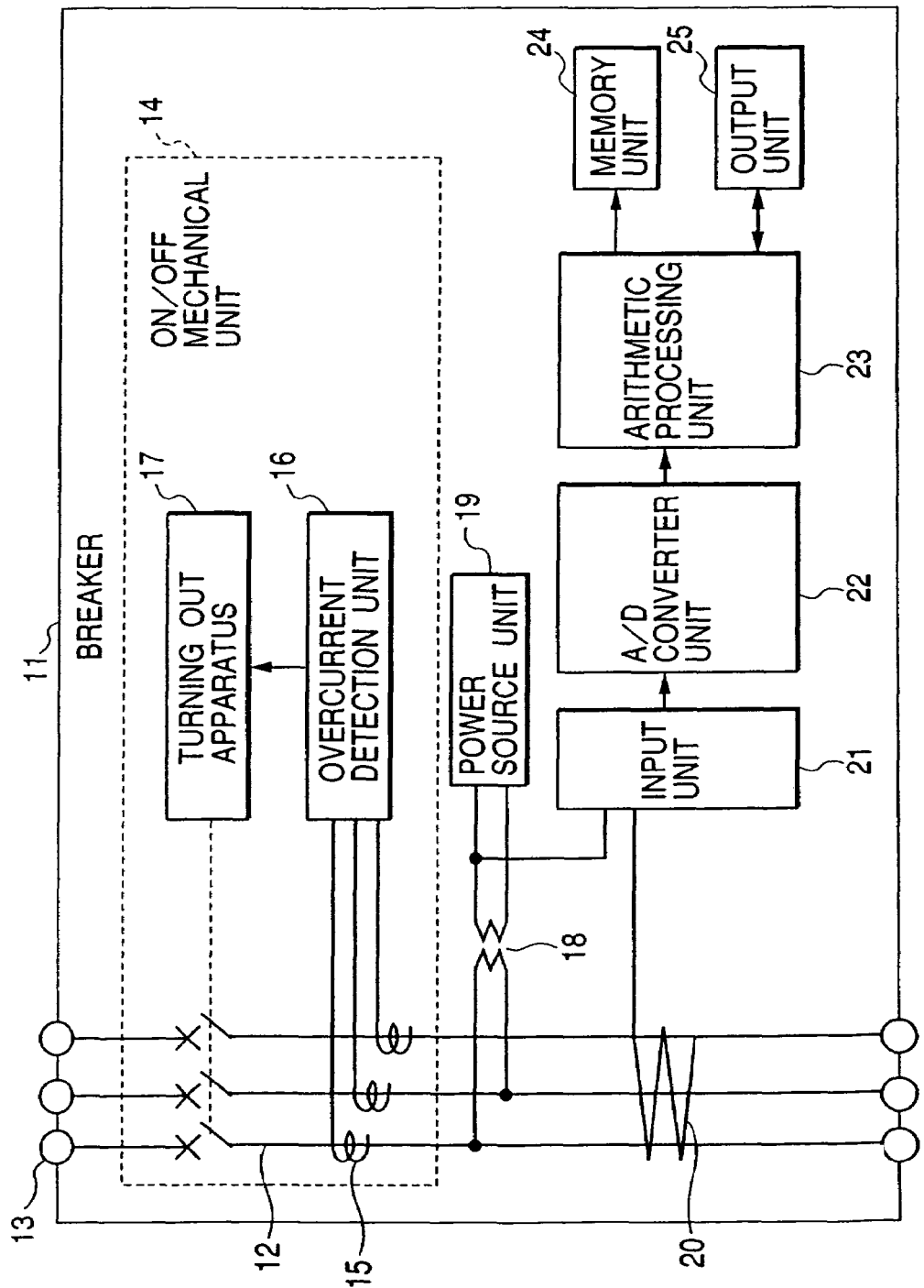
FIG. 5 is a structural diagram showing an embodiment of a leakage current measurement system that uses a circuit breaker in accordance with the present invention.

FIG. 5 is a structural diagram showing an exemplary leakage current measurement system that uses a circuit breaker in accordance with the present invention. The circuit breaker 11 comprises an off/on mechanical unit 14 and a leakage measurement unit. In the on/off mechanical unit 14, 12 denotes a cable way that connects the receiving end of the transformer 40 side to the supply end terminal of the load 43 side, and the cable way is opened/closed by means of the on/off mechanical unit 14. Furthermore, the on/off mechanical unit 14 comprises a breaker unit 27, a current transformer 15 for detecting a current, an overcurrent detection unit 16 for detecting overcurrent in response to a signal supplied from the current transformer 15 for detecting a current, and a turning out apparatus 17 for shutting down the breaker unit 27.

In the measurement unit, 20 denotes a non-contact type current detector for measurement of the leakage current of the cable way, 18 denotes a built-in step-down transformer of the breaker 11, 19 denotes a power source unit for supplying a suitable voltage to the inside, 21 denotes an input unit for receiving the output of the current detector 20 and the transformer 18 and for converting it to a suitable internal signal, 22 denotes an A/D converter unit for sampling the output of the input unit 21 and for converting the output to a digital value when a command of the arithmetic processing unit 23 described next is received. 23 denotes the arithmetic processing unit that supplies a sampling command and digital conversion command to the A/D converter unit 22, stores the obtained digital value in the memory unit 24, and calculates the resistance component leakage current by means of any one of the methods described in the first embodiment to the twelfth embodiment. Furthermore, the arithmetic processing unit 23 supplies the resistance component leakage current value that is the calculation result to an output unit 25, which will be described hereinafter. The output unit 25 visually displays the calculation result obtained by means of the arithmetic processing unit 23 on a display apparatus, or transmits the calculation result to remote sites. For example, a display apparatus having six digit segment display apparatus comprising an aggregate of light emitting diodes (LED element) or a power-saving liquid crystal type display apparatus may be used as the visual display apparatus for displaying the leakage current value and the resistance value.

Otherwise, as the remote transmission, the transmission method based on RS-232C and RS-485 standard that is American Industrial Association (EIA) Standard or the wireless transmission that uses radio wave or infrared ray may be used.

In the above-mentioned structure, the voltage V (the circuit voltage is a single phase or single-phase three-lines, or two line drawing from three-phase three-lines) or the voltage RS and the leakage current Iz are supplied to the input unit 21, and subjected to arithmetic by means of the arithmetic processing unit 23. As the result, the current value of the resistance component leakage current can be obtained. As described hereinabove, the resistance component leakage current can be obtained by means of the above-mentioned structure and any one of the methods described in the first embodiment to the twelfth embodiment.

Next, the ninth and tenth embodiments of the present invention will be described herein under with reference to FIG. 6 and FIG. 7.

Figure 6:
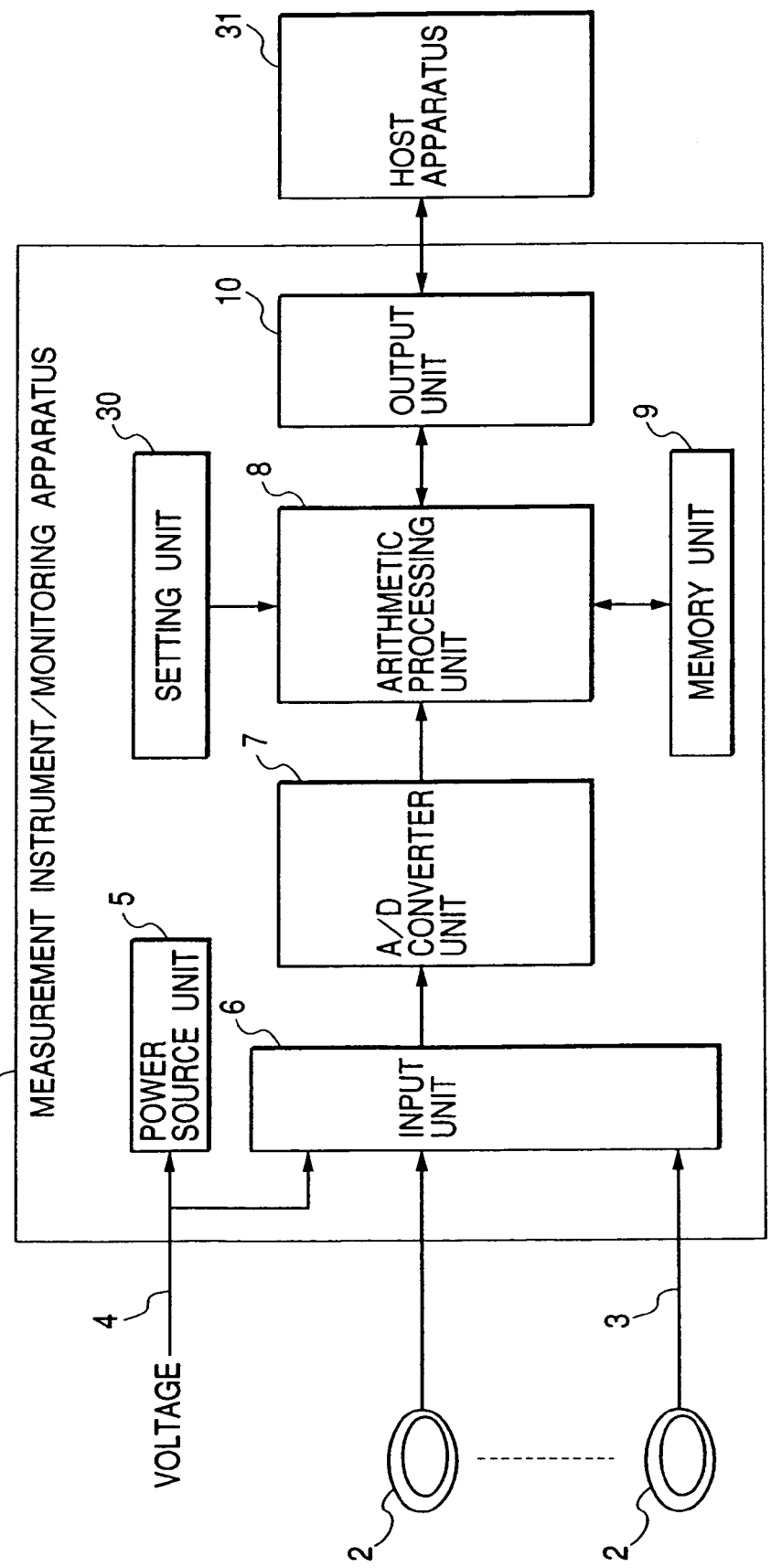
FIG. 6 is a structural diagram showing an embodiment of a leakage current measurement system that uses a monitoring apparatus in accordance with the present invention.

FIG. 6 is a structural diagram showing another embodiment of a leakage current measurement system that uses a monitoring apparatus in accordance with the present invention. FIG. 6 shows a system comprising a measurement instrument or monitoring apparatus and a host apparatus, the structure of the measurement instrument or monitoring apparatus is the same as that shown in FIG. 4. The same components as shown in FIG. 4 are given the same characters, and the description is omitted.

Figure 7:
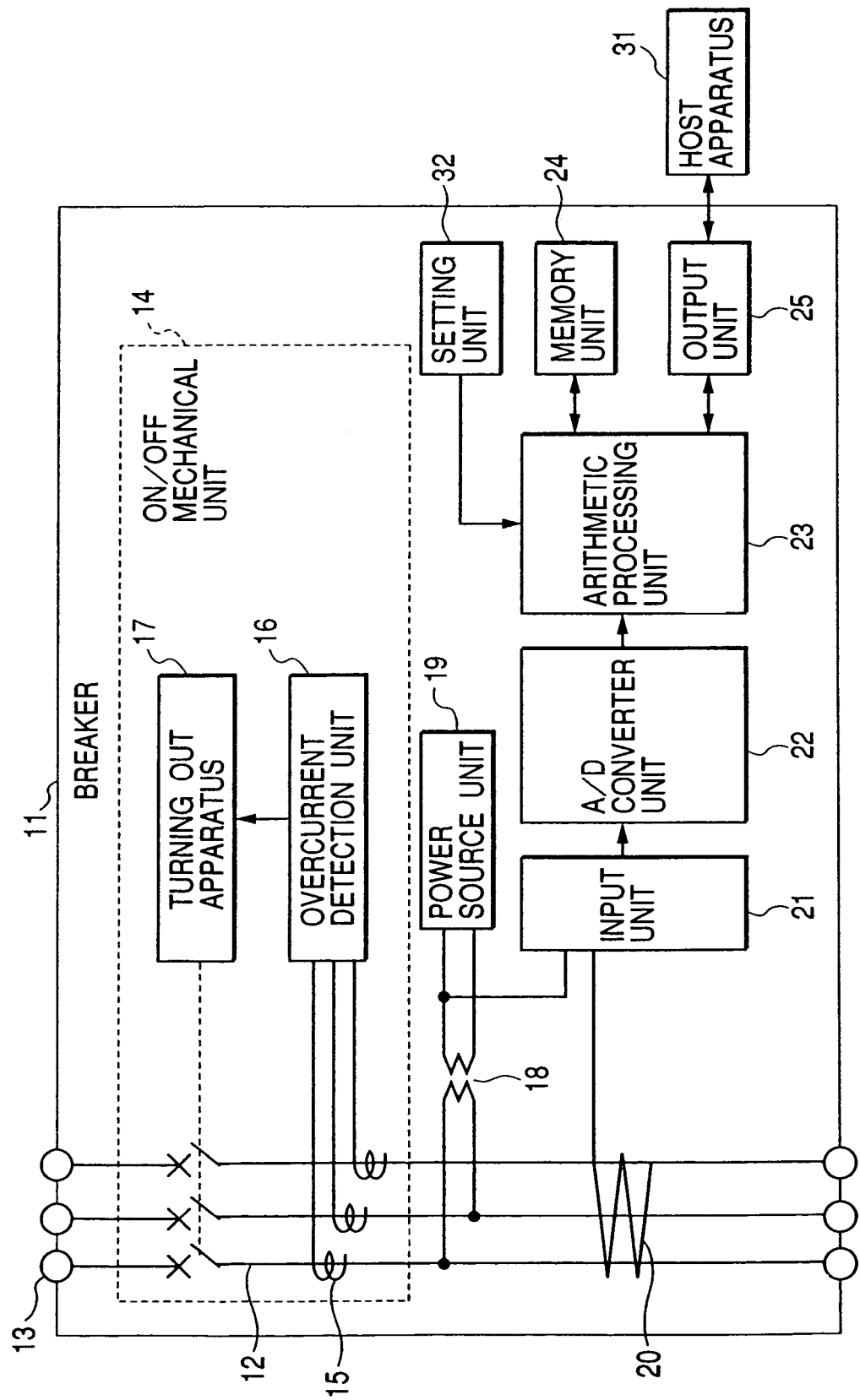
FIG. 7 is a structural diagram showing an embodiment of a leakage current measurement system that uses a breaker in accordance with the present invention.

FIG. 7 is a structural diagram showing another embodiment of a leakage current measurement system that uses a breaker in accordance with the present invention. The structure of the breaker 11 is the same as that shown in FIG. 5. The same components as shown in FIG. 5 are given the same characters, and the description is omitted.

Herein, the host apparatus 31 is, for example, a personal computer, and an output unit 10 and a communication means connect the host apparatus 31 to the above-mentioned measurement instrument or monitoring apparatus (terminal apparatus) 1 or the breaker 11. The output unit 10 is the same as the above-mentioned output unit 25. Furthermore, the host apparatus 31 stores or displays the information obtained from the terminal apparatus 1 or the breaker 11. The information means the resistance component leakage current and the resistance value. Therefore, the host apparatus 31 also displays the change of the resistance component current leakage value with time graphically.

In the above-mentioned description, the system having a single measurement instrument or monitoring apparatus and breaker 11 is described, however, a plurality of terminal apparatuses 1 or breakers may be used without problem. The above-mentioned system may be a system having terminal apparatus such as measurement instrument, monitoring apparatus, and breakers combined.

Also, FIG. 6 shows a measurement instrument or monitoring apparatus 1 having a setting unit 30, and FIG. 7 shows a breaker 11 having a setting unit 32. The setting units 30 and 32 can serve to set a value such as alarming level value. The set value is compared with a measured value, and if the measured value exceeds the set value, an alarm is generated. For example, the measure resistance component leakage current is compared with an alarming level in the first to third embodiments or the fifth to thirteenth embodiments. For example, a built-in relay contact of the output unit 25 is closed to thereby generate an alarm sound, display an alarm image, or transmit an alarm signal to remote sites through communication line.

Further, the content of the output supplied to the relay contact in the ninth and tenth embodiments remains as it was. For example, in the case that the relay is turned on due to the resistance component leakage current value that exceeds the set value, the relay is remaining in ON-state until an ascertainment key of the setting unit 30 or 32 is operated. This system is useful to find out the cause of the trouble after an alarm is generated as the result of comparison with the alarming level, and restoration from the trouble is achieved. Therefore, it is easy to find out the cause of the trouble.

Further, the setting units 30 and 32 can serve to set a set value that is a value for comparison as described in the ninth and tenth embodiments, and the setting can be operated from the host apparatus 31 because a communication means is provided. Thereby, such system allows the staff not to go to the setting site for setting work because the setting unit can be set by remote communication, and the setting work can be done efficiently.

Next, the eleventh embodiment will be described with reference to FIG. 8.

Figure 8:
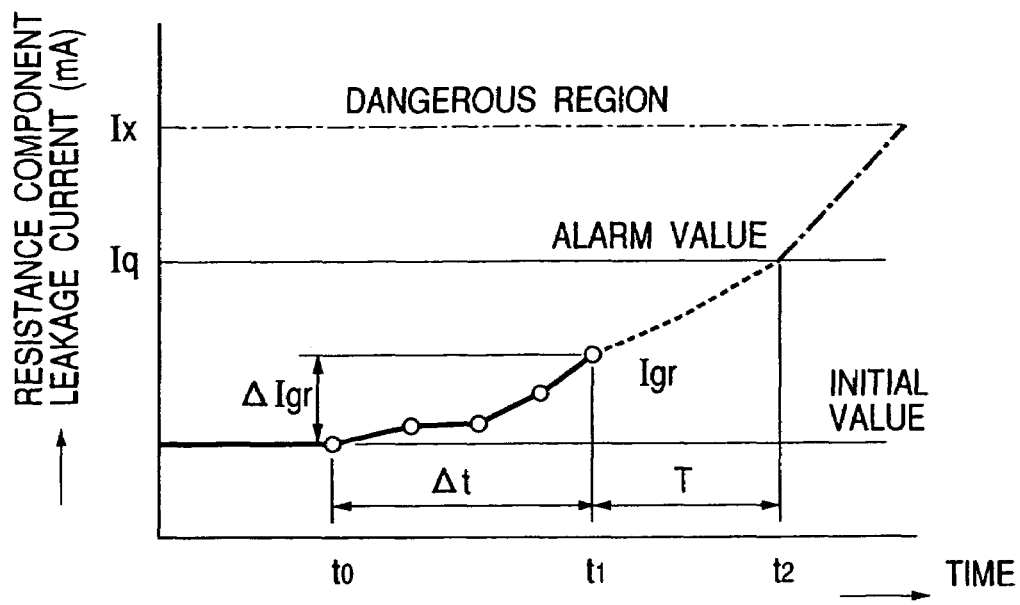
FIG. 8 is a characteristic diagram showing the resistance component current value change with time.

FIG. 8 is a characteristic diagram showing the change of the resistance component leakage current value with time. The abscissa represents the time, and the ordinate represents the resistance component leakage current value (mA). It is the object of the present invention to measure the resistance component leakage current included in the leakage current so as to determine the insulation deterioration state. Generally, insulation deterioration proceeds very slowly over a long time not within a short time. Therefore, if the time of reaching to the predetermined alarm level (alarm value) is predicted, the power supply interruption can be planned previously for replacing the deteriorated insulation parts, and the sudden failure can be prevented.

It is possible to predict the deterioration by monitoring a graph that shows the change of the resistance component leakage current value with time until now and to predict the change of the resistance component leakage current that will be after a predetermined time.

In FIG. 8, it is assumed that the resistance component leakage current value begins to increase at the time t0 and increases by ΔIgr at the time t1, and the alarm value of the resistance component current value Igr is Iq. It is possible to predict that the resistance component leakage current value will reach Iq around t2 based on the resistance component leakage current change during the time t0 to t1.

The resistance component leakage current is not necessarily stable and involved in dispersion problem to cause difficulty in the prediction. However, the resistance component current is preferably predicted by means of the method of least squares that is the demand monitoring technique of the distribution system, which is disclosed in Japanese Patent Laid-Open No. 2000-014003 applied for by the inventors of the present invention. This method is served to predict the power consumption that will be after residual time T. On the other hand in this embodiment, a set value (alarm value) Iq of the resistance component leakage current value Igr that is set previously is set instead of the power (Q), and the residual time (T) is determined reversely. In detail, the resistance component leakage current ΔIgr is measured and stored at a plurality of time points between the current time point t1 and the time point before Δt shown in FIG. 8, and the time period T during which the resistance component current reaches to the set value (alarm value) Q point is predicted.

The leakage current Ix that is in a dangerous region is predicted by employing this method, and the time period during which the leakage current reaches to Ix is predicted.

The time period during which the resistance component leakage current reaches the alarm level (alarm value) is predicted by means of the above-mentioned method.

Further, in the eleventh embodiment, the alarm signal is one-way communicated from the measurement instrument, monitoring apparatus 1, or breaker 11 to the host apparatus 31. However, two-way communication may be preferably employed for easy mutual communication. In detail, the if the host apparatus 31 requests the information to a plurality of terminal apparatus of the monitoring apparatus successively as required, the terminal apparatus transmits the information to the host apparatus 31 in response to the request. As a result, collision of communication signals would be prevented and communication processing would be facilitated.

For another thing, the communication employed in the eleventh embodiment is wire communication generally. However, a lot of laying work is required for the wire communication. To avoid such laying work, the radio communication, namely wireless communication, is employed in this embodiment. According to this method, the man-hours required for installation are reduced significantly.

The memory units 9 and 24 are used in the seventh embodiment to the tenth embodiment shown in FIG. 4 to FIG. 7 mainly to store the voltages at the time of sampling. In this embodiment, the resistance component leakage current that is the calculation result is stored at a predetermined interval in the memory units 9 and 24, and the stored value is read out as required. According to this embodiment, the past data can be referred to and is used effectively for data analysis.

Next, the apparent view of a monitoring apparatus will be described.

Figure 11:
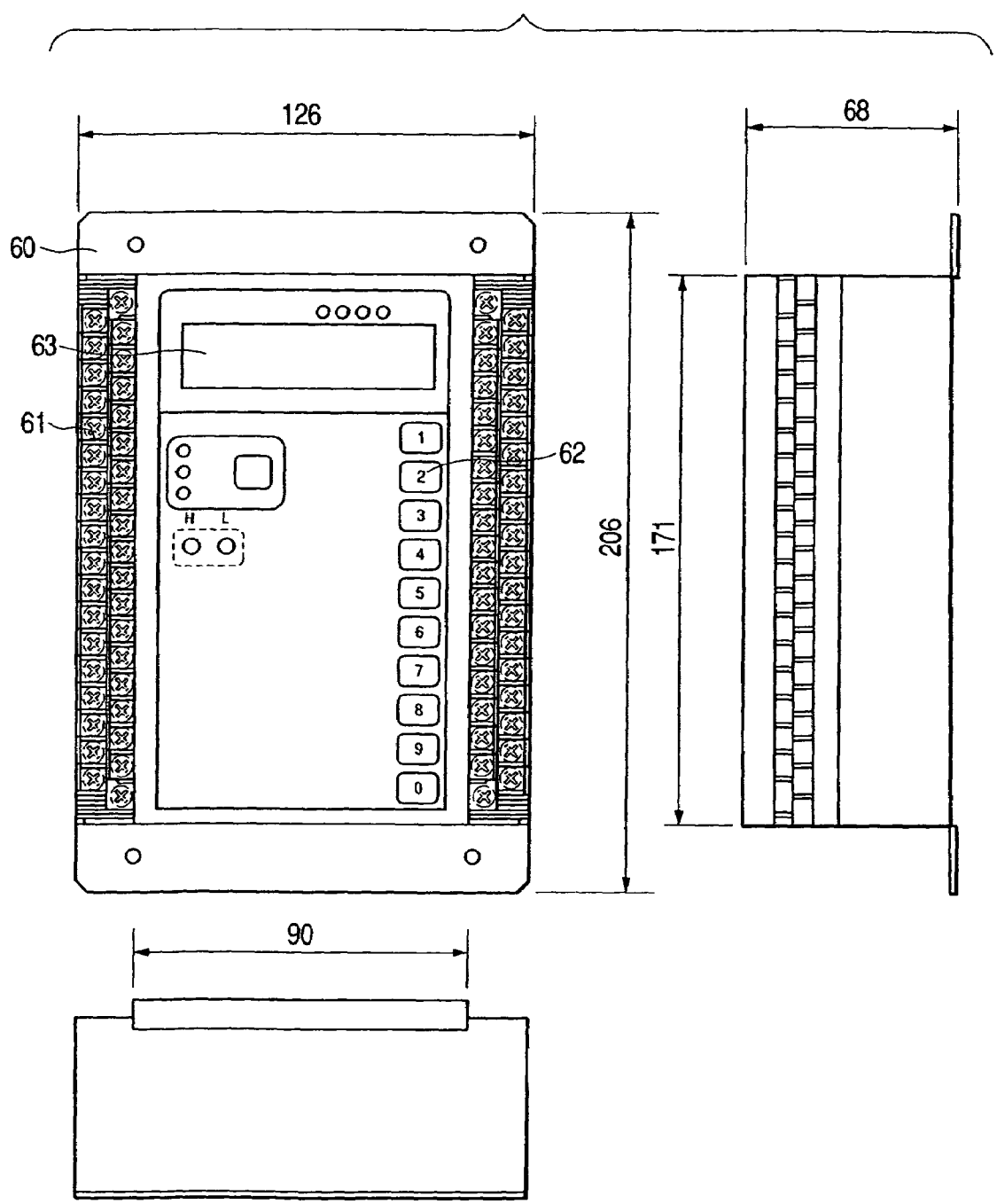
FIG. 11 is an apparent view of an insulation monitoring apparatus.

FIG. 11 is an apparent view of a monitoring apparatus, which is provided in a distribution panel as described hereunder. In FIG. 11, 60 denotes a box for containing components, 61 denotes a terminal table for connecting a current signal line 3 and a voltage signal line 4 extending from a current transformer 20, 62 denotes a setting unit for setting the alarm level and the ratio of current transformation, for selecting a plurality of inputs, and for switching the display type, and 63 denotes a display unit for displaying the value at the setting, and for displaying the leakage current value and the resistance value that are obtained as the result of operation of an arithmetic processing unit.

FIG. 12 is an apparent view of a monitoring apparatus, which is mounted on the panel surface of a distribution panel. In FIG. 12, 64 denotes a box for containing components, 65 denotes a terminal table for connecting a current signal line 3 and a voltage signal line 4 extending from a current transformer 20, 66 denotes a setting unit for setting the alarm level and the ratio of current transformation, for selecting a plurality of inputs, and for switching the display type, 67 denotes a display unit for displaying the value at the time of setting, and for displaying the leakage current value and the resistance value that are obtained as the result of operation of an arithmetic processing unit, and 68 denotes a bolt for fixing on the panel surface 69 of the distribution panel.

Figure 13A:
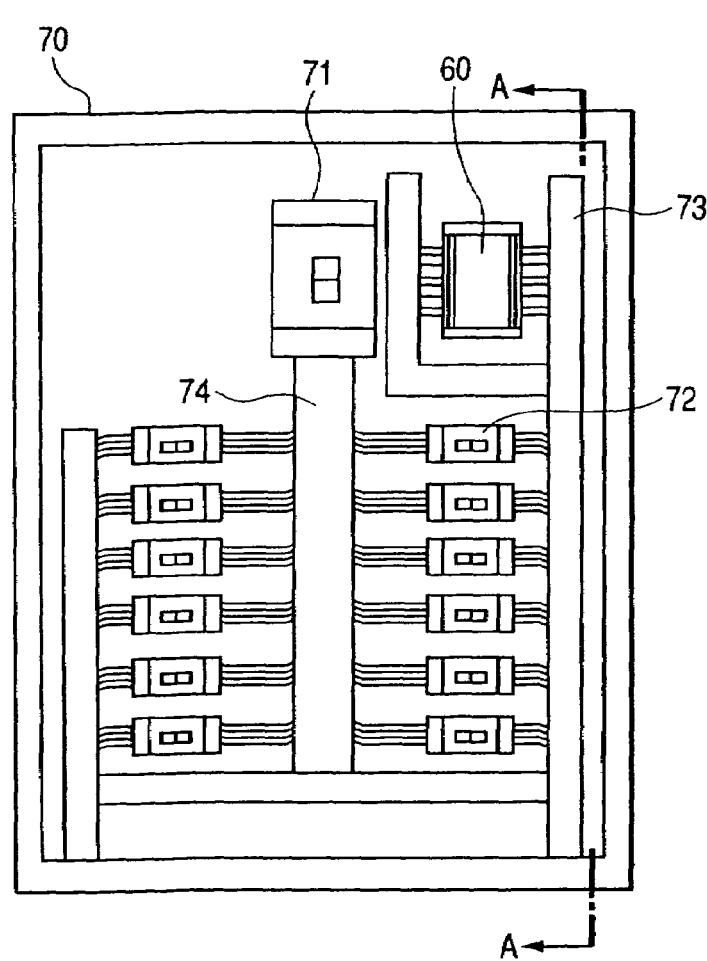
FIG. 13 is a diagram showing an insulation monitoring apparatus contained in a distribution panel.
Figure 13B:
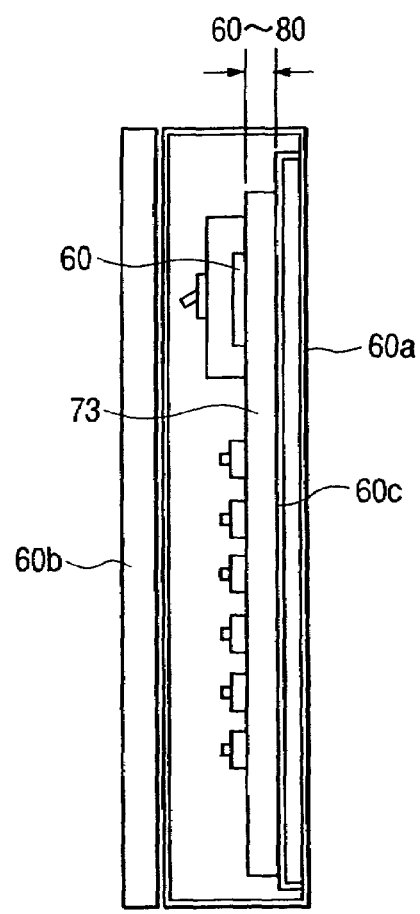

FIG. 13 is a view showing the monitoring apparatus contained in the distribution panel. In FIG. 13, 70 denotes a distribution panel body, 60*a* denotes a case, 60*b* denotes a door, and 60*c* denotes a back plate. 71 denotes a main circuit breaker of the distribution circuit, 72 denotes a branching breaker of the distribution circuit, 73 denotes a duct for containing arranged wirings, 74 denotes a duct for containing arranged main circuit wirings of the distribution circuit, and 75 denotes a monitoring apparatus of the type contained in the distribution panel.

Herein the monitoring apparatus shown in FIG. 11 is an apparatus of the type that is contained in a distribution panel. The size of the box 60 is 206 mm×142 mm.

The monitoring apparatus shown in FIG. 12 is an apparatus of the type that is mounted on the panel face of a distribution panel. The size of the box is 206 mm×142 mm. Such monitoring apparatus as described hereinabove having one side of about 200 mm and the other side in a range from 100 mm to 200 is smaller than the conventional monitoring apparatus and the space for installing a monitoring apparatus is saved, and the monitoring apparatus can be contained in a distribution panel that is used generally.

The depth size of an monitoring apparatus, particularly the height of a terminal table, corresponds to the height of the above-mentioned duct 73. A duct having height of 60 mm popularly used as shown in the A-A cross sectional view of the distribution panel. Therefore, a terminal table having a height of about 60 mm to 80 mm brings about easy wiring, namely improved workability, and the appearance after wiring is improved.

Furthermore, the width and height of a monitoring apparatus relates to the outside dimension of a distribution panel, a monitoring apparatus having the outside dimension as shown in FIG. 11 can be contained in a free space of a distribution panel, and a distribution panel having a conventional dimension can be used.

As described hereinabove, according to the present invention, the resistance component leakage current can be measured even if the electrostatic capacity of the load of a wiring circuit is large.

Furthermore, because it is not necessary to apply an external voltage, the load component is not affected adversely.

Furthermore, a monitoring apparatus has the simple structure, does not require an auxiliary impedance element, and can be applied to a plurality of distribution circuits.

Because it is possible to measure the reliable high resistance component leakage current value and the resistance value and to specify the insulation deterioration phase, the monitoring apparatus is useful for check and maintenance and brings about prevention of failure by monitoring the change of insulation deterioration with time and by generating alarm when required.

What is claimed is:

1. A leakage current measurement apparatus comprising:
   an amplifier unit for amplifying the output signals of a zero-phase current transformer which is installed on a target measurement circuit and detects any leakage current;
   an A/D converter unit for converting analog signals, which are output signals of the amplifier unit, into digital signals;
   a zero-cross detecting circuit for detecting a voltage zero-crossing point of said target measurement circuit and outputting a sampling start signal;
   a memory unit for storing digital data of a sine wave form whose effective value is 1; and
   a CPU mainly intended for arithmetic processing, wherein:
   the output signal of said zero-phase current transformer is sampled with said sampling start signal, products of multiplication are averaged by synchronizing the sampled output signal value and said stored digital data of a sine wave form whose effective value is 1, and an active component current of leakage currents is obtained.

2. The leakage current measurement apparatus according to claim 1, wherein:
   said memory unit stores the digital data of a sine wave form whose effective value is 1 in a finely split form, and multiplication is performed by using digital data delayed or advanced by the same quantity as an advance or a delay of the phase of the output signals of the zero-phase current transformer.

3. The leakage current measurement apparatus according to claim 1 or 2, wherein:
   the products of multiplication of digital data advanced by 30 degrees from the sine wave form data whose effective value is 1 and the sampled output signal values of the zero-phase current transformer are averaged to obtain the active component leakage current of the leakage currents from a three-phase delta circuit.

* * * * *